(12) United States Patent
Ouyang et al.

(10) Patent No.: US 11,282,854 B2
(45) Date of Patent: Mar. 22, 2022

(54) 3D NAND MEMORY DEVICE AND METHOD OF FORMING THE SAME

(71) Applicant: Yangtze Memory Technologies Co., Ltd., Wuhan (CN)

(72) Inventors: Yingjie Ouyang, Wuhan (CN); Zhiliang Xia, Wuhan (CN); Lei Jin, Wuhan (CN); Qiguang Wang, Wuhan (CN); Wenxi Zhou, Wuhan (CN); Zhongwang Sun, Wuhan (CN); Rui Su, Wuhan (CN); Yueqiang Pu, Wuhan (CN); Jiwei Cheng, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 55 days.

(21) Appl. No.: 16/684,793

(22) Filed: Nov. 15, 2019

(65) Prior Publication Data

US 2021/0066335 A1 Mar. 4, 2021

Related U.S. Application Data

(63) Continuation of application No. PCT/CN2019/103208, filed on Aug. 29, 2019.

(51) Int. Cl.
*H01L 27/11582* (2017.01)
*G11C 5/06* (2006.01)
(Continued)

(52) U.S. Cl.
CPC ........ *H01L 27/11582* (2013.01); *G11C 5/063* (2013.01); *H01L 23/5226* (2013.01);
(Continued)

(58) Field of Classification Search
CPC ......... H01L 27/11582; H01L 27/11556; H01L 27/0688; H01L 23/5226; H01L 23/5283
See application file for complete search history.

(56) References Cited

U.S. PATENT DOCUMENTS

| 7,927,953 B2 | 4/2011 | Ozawa |
| 8,841,183 B2 | 9/2014 | Ozawa |
| (Continued) | | |

FOREIGN PATENT DOCUMENTS

| CN | 107431072 A | 12/2017 |
| CN | 107768446 A | 3/2018 |
| (Continued) | | |

OTHER PUBLICATIONS

International Search Report and Written Opinion dated May 27, 2020 In PCT/CN2019/103208, citing documents AA, AC, AO an AP therin, 9 pages.

*Primary Examiner* — Zandra V Smith
*Assistant Examiner* — John M Parker
(74) *Attorney, Agent, or Firm* — Oblon, McClelland, Maier & Neustadt, L.L.P.

(57) ABSTRACT

A semiconductor device is provided. The semiconductor device includes a channel structure that extends from a side of a substrate. The channel structure has sidewalls and a bottom region. The channel structure includes a bottom channel contact that is positioned at the bottom region, and a channel layer that is formed along the sidewalls and over the bottom channel contact. The channel structure further includes a high-k layer that is formed over the channel layer along the sidewalls of the channel structure and over the bottom channel contact.

24 Claims, 15 Drawing Sheets

(51) Int. Cl.
  *H01L 23/522* (2006.01)
  *H01L 23/528* (2006.01)
  *H01L 27/11565* (2017.01)
  *H01L 27/1157* (2017.01)

(52) U.S. Cl.
  CPC ...... *H01L 23/5283* (2013.01); *H01L 27/1157* (2013.01); *H01L 27/11565* (2013.01)

(56) References Cited

U.S. PATENT DOCUMENTS

| | | | |
|---|---|---|---|
| 8,946,021 B2 | 2/2015 | Ozawa | |
| 9,219,076 B2 | 12/2015 | Ozawa | |
| 9,230,980 B2* | 1/2016 | Rabkin | H01L 27/11578 |
| 10,002,875 B2 | 6/2018 | Nam et al. | |
| 2005/0138262 A1 | 6/2005 | Forbes | |
| 2010/0140684 A1 | 6/2010 | Ozawa | |
| 2011/0003452 A1 | 1/2011 | Lai et al. | |
| 2011/0156131 A1 | 6/2011 | Ozawa | |
| 2014/0353591 A1 | 12/2014 | Kim et al. | |
| 2014/0357032 A1 | 12/2014 | Ozawa | |
| 2015/0137212 A1 | 5/2015 | Ozawa | |
| 2017/0365613 A1* | 12/2017 | Gunji-Yoneoka | H01L 27/11524 |
| 2018/0053775 A1 | 2/2018 | Nam et al. | |
| 2018/0175050 A1* | 6/2018 | Son | H01L 27/11582 |
| 2020/0111808 A1* | 4/2020 | Liu | H01L 27/11556 |
| 2020/0126974 A1* | 4/2020 | Liu | H01L 29/1037 |

FOREIGN PATENT DOCUMENTS

| | | |
|---|---|---|
| CN | 109148467 A | 1/2019 |
| CN | 109192733 A | 1/2019 |
| CN | 109346474 A | 2/2019 |
| CN | 109346480 A | 2/2019 |
| CN | 109616473 A | 4/2019 |
| CN | 109887927 A | 6/2019 |
| CN | 110088906 A | 8/2019 |
| CN | 110112136 A | 8/2019 |
| CN | 110114878 A | 8/2019 |
| CN | 110137178 A | 8/2019 |
| WO | WO 2017/204870 A1 | 11/2017 |

* cited by examiner

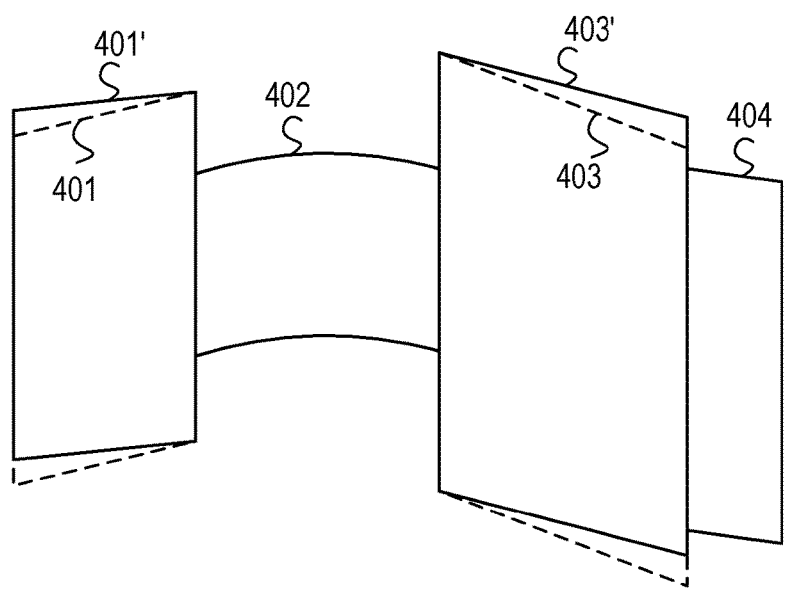
FIG. 4
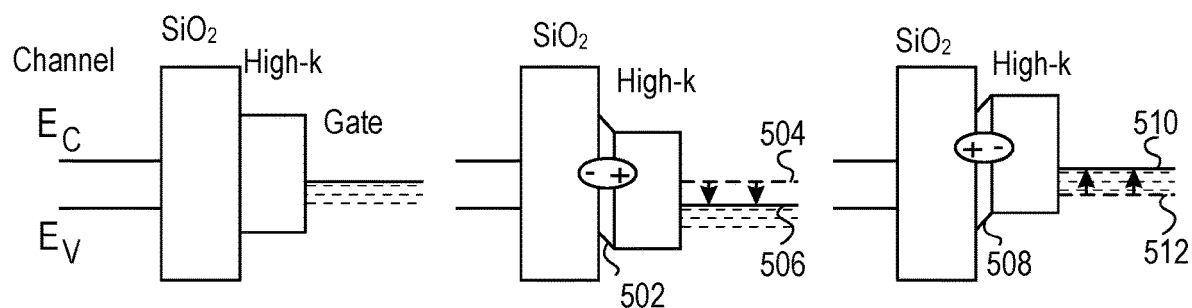
FIG. 5A     FIG. 5B     FIG. 5C

3D NAND MEMORY DEVICE AND METHOD OF FORMING THE SAME

RELATED APPLICATION

This application is a bypass continuation of International Application No. PCT/CN2019/103208, filed on Aug. 29, 2019. The entire disclosure of the prior application is hereby incorporated by reference in its entirety.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit.

The disclosure relates to non-volatile memory devices, and more particularly, to vertical-type 3D NAND memory devices in which channel structures extend in a vertical direction. While the sizes of electronic products may be gradually reduced, there may be demand for the products to perform data processing at higher capacity. Accordingly, an integration degree of semiconductor memory devices used in the electronic products may be increased. One method of increasing the integration degree of semiconductor memory devices may involve non-volatile memory devices having a vertical structure, instead of a planar transistor structure.

Compared to a planar transistor structure, the vertical structure of the 3D NAND memory devices requires more critical and complicated manufacturing processes. As the 3D NAND memory devices migrates to configurations with more memory cell layers to achieve higher densities at a lower cost per bit, it becomes an increasing challenge to improve structures and methods for manufacturing the same. For example, it is challenging to control an initial threshold voltage (Uvvt) of a memory cell in the 3D NAND memory devices as more memory cell layers are introduced.

SUMMARY

A 3D NAND memory device can include a plurality of memory cell strings. Each memory cell string can have a plurality of word lines that are separated by a plurality of insulating layers from each other, where the insulating layers and the word lines are positioned over a substrate, and are alternatively stacked so that the word lines are spaced apart from one another by the insulating layers. Each memory cell string can also have a channel structure that vertically extends through the word lines and the insulating layers from the substrate. The channel structure has sidewalls and a bottom region. The channel structure includes a bottom channel contact that is positioned at the bottom region of the channel structure.

In the channel structure, a blocking layer (also referred to as gate dielectric layer) is formed along the sidewalls of the channel structure and further covers a portion of the bottom channel contact. A charge trapping layer is formed over the blocking layer. The charge trapping layer has side portions formed along the sidewalls of the channel structure and a bottom portion positioned over the bottom channel contact. A tunneling layer is formed over the charge trapping layer. The tunneling layer has side portions that are positioned along the sidewalls of the channel structure and a bottom portion over the bottom channel contact. Moreover, a channel layer is formed over the tunneling layer along the sidewalls of the channel structure. The channel layer further extends through the bottom portions of the blocking layer, the charge trapping layer, and the tunneling layer so as to contact the bottom channel contact.

In some embodiments, the channel layer is made of a high quality and thin poly silicon (Si). The poly Si can cause a negative Uvvt. The Uvvt can be an initial threshold voltage of a memory cell in the memory string before any cycling test is operated. The Uvvt of the memory cell can be tuned by adjusting a thickness of the poly Si. However, a series of parameters, such as Ion (on current), SS (subthreshold slope) can be affected due to the adjusted poly Si thickness. In the present disclosure, a high-k layer is arranged over the channel layer in the channel structure. The high-k layer can result in a formation of a plurality of electric dipoles, which in turn can affect the Uvvt of the memory cell. The high-k layer can be made of a first material that provides positive electric dipoles and increases the Uvvt, or a second material that provides negative electric dipoles and reduces Uvvt. The Uvvt of the memory cell accordingly can be adjusted based on the high-k layer.

According to an aspect of the present disclosure, a semiconductor device is provided. The semiconductor device includes a channel structure that extends from a side of a substrate. The channel structure has sidewalls and a bottom region. The channel structure includes a bottom channel contact that is positioned at the bottom region, and a channel layer that is formed along the sidewalls and over the bottom channel contact. The bottom channel contact extends into the substrate so that the channel structure is coupled to the substrate. The channel structure further includes a high-k layer that is formed over the channel layer along the sidewalls of the channel structure and over the bottom channel contact.

In the present disclosure, the high-k layer can include a first material that increases an initial threshold voltage (Uvvt) of the semiconductor device, and a second material that reduces the initial threshold voltage of the semiconductor device. In addition, an increased thickness of the high-k layer results in a larger change of the initial threshold voltage (Uvvt) of the semiconductor device. The first material can include $HfO_2$ and $Al_2O_3$, and the second material can include $La_2O_3$ and $Y_2O_3$.

The disclosed semiconductor device can also include a blocking layer that is formed along the sidewalls of the channel structure and further covers a first portion of the bottom channel contact, and a charge trapping layer that is formed over the blocking layer. The charge trapping layer has side portions along the sidewalls of the channel structure and a bottom portion over the bottom channel contact. The semiconductor device further has a tunneling layer formed over the charge trapping layer. The tunneling layer has side portions along the sidewalls of the channel structure and a bottom portion over the bottom channel contact. The channel layer is positioned over the tunneling layer and further extends through the bottom portions of the blocking layer, the charge trapping layer, and the tunneling layer so as to contact a second portion of the bottom channel contact.

In some embodiments, the blocking layer can be formed along the sidewalls of the channel structure and further cover a first top surface of the bottom channel contact. The charge trapping layer can be formed over the blocking layer. The charge trapping layer can have side portions positioned along the sidewalls of the channel structure and a bottom portion over the first top surface of the bottom channel contact. The tunneling layer can be formed over the charge trapping layer, where the tunneling layer has side portions positioned along the sidewalls of the channel structure and a bottom portion over the first top surface of the bottom channel contact. The channel layer can be positioned over the tunneling layer, extends through the bottom portions of the blocking layer and the charge trapping layer, and further extends into the bottom channel contact so as to contact a second top surface of the bottom channel contact.

In some embodiments, a dielectric layer can be formed over the channel layer and along the sidewalls of the channel structure, wherein the high-k layer is positioned over the dielectric layer so that the dielectric layer is positioned between the high-k layer and the channel layer. In some embodiments, side portions of the high-k layer formed along the sidewalls of the channel structure are spaced apart from the channel layer by the dielectric layer, and a bottom portion of the high-k layer over the bottom channel contact is in contact with the channel layer.

The disclosed semiconductor device further includes a top channel contact that is positioned over the high-k layer and further surrounded by the channel layer. In the disclosed semiconductor device, a plurality of word lines and a plurality of insulating layers are positioned over the substrate. The plurality of word lines and the plurality of insulating layers are alternatively stacked so that the plurality of word lines are spaced apart from one another by the plurality of the insulating layers. The channel structure extends through the plurality of word lines and the plurality of insulating layers.

According to another aspect, a method for forming a semiconductor device is disclosed. In the disclosed method, a plurality of word lines and a plurality of insulating layers are formed over the substrate. The plurality of word lines and the plurality of insulating layers are alternatively stacked so that the plurality of word lines are spaced apart from one another by the plurality of the insulating layers. A channel opening is then formed in the word lines and the insulating layers. The channel opening extends through the word lines and the insulating layers, and further extends into the substrate, where the channel opening has sidewalls and a bottom region to expose the substrate.

Subsequently, a bottom channel contact is formed at the bottom region of the channel opening. The bottom channel contact is formed along the sidewalls of the channel opening and further extends into the substrate. A blocking layer is then formed along the sidewalls of the channel opening and over the bottom channel contact, where the blocking layer has side portions along the sidewalls of the channel opening and a bottom portion covering the bottom channel contact. A charge trapping layer is formed over the blocking layer. The charge trapping layer has side portions along the sidewalls of the channel opening and a bottom portion over the bottom channel contact. Further, a tunneling layer is formed over the charge trapping layer, where the tunneling layer has side portions along the sidewalls of the channel opening and a bottom portion over the bottom channel contact.

A bottom opening is therefore formed that extends through the bottom portions of the blocking layer, the charge trapping layer, and the tunneling layer to expose the bottom channel contact. A channel layer is formed over the tunneling layer and through the bottom opening so that the channel layer extends through the blocking layer, the charge trapping layer, and the tunneling layer to contact the bottom channel contact. A high-k layer can be formed over the channel layer, where the high-k layer can be positioned along the sidewalls of the channel opening and over the bottom channel contact.

In some embodiments, a dielectric layer can be formed over the channel layer along the sidewalls of the channel opening, and the high-k layer can be formed over the dielectric layer so that the dielectric layer is positioned between the high-k layer and the channel layer. In some embodiments, side portions of the high-k layer formed along the sidewalls of the channel opening are spaced apart from the channel layer by the dielectric layer, and a bottom portion of the high-k layer over the bottom channel contact is in contact with the channel layer.

According to yet another aspect of the present disclosure, a 3D NAND memory device is disclosed. The memory device has a substrate, a plurality of word lines and a plurality of insulating layers that are positioned over the substrate. The plurality of word lines and the plurality of insulating layers are alternatively stacked so that the plurality of word lines are spaced apart from one another by the plurality of the insulating layers. The memory device also has a channel structure that extends through the plurality of word lines and the plurality of insulating layers from the substrate. The channel structure has sidewalls and a bottom region. The channel structure further includes a bottom channel contact that is positioned at the bottom region and a channel layer that is formed along the sidewalls and over the bottom channel contact. The channel structure further includes a high-k layer that is formed over the channel layer along the sidewalls of the channel structure and over the bottom channel contact.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a schematic diagram of an energy bandgap in a channel structure of an exemplary 3D NAND memory device, in accordance with some embodiments.

FIG. 5A is a first energy band diagram of a channel structure in an exemplary 3D NAND memory device, in accordance with some embodiments.

FIG. 5B is a second energy band diagram of a channel structure in an exemplary 3D NAND memory device when a positive electric dipole is introduced, in accordance with some embodiments.

FIG. 5C is a third energy band diagram of a channel structure in an exemplary 3D NAND memory device when a negative electric dipole is introduced, in accordance with some embodiments.

DETAILED DESCRIPTION

Figure 1:
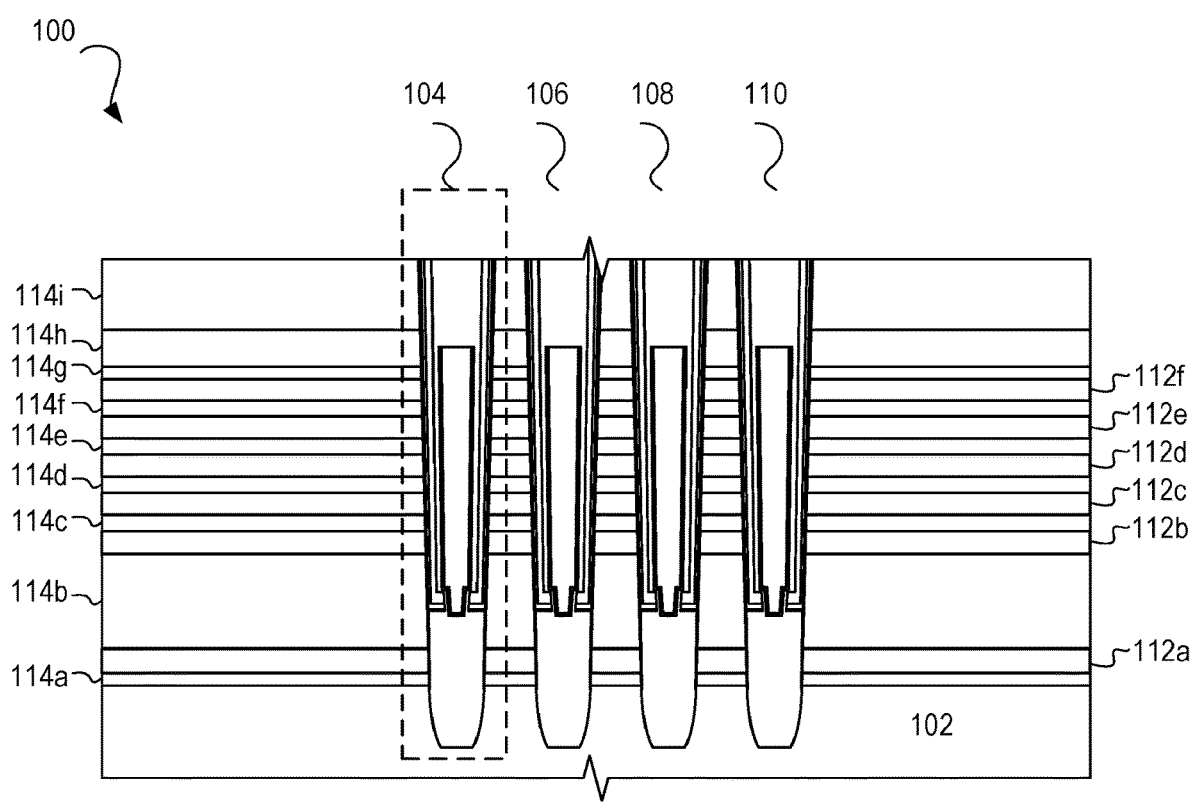
FIG. 1 is a cross-sectional view of an exemplary 3D NAND memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a 3D NAND memory device 100, in accordance with some embodiments of the present disclosure. The memory device 100 can have a substrate 102. A plurality of word lines 112a-112f can be formed over the substrate 102. In addition, a plurality of insulating layers 114a-114i are positioned over the substrate 102. The word lines 112 and the insulating layers 114 are alternatively stacked so that the word lines 112 are spaced apart from one another by the insulating layers 114.

The memory device 100 can also have a plurality of channel structures. For example, four channel structures 104-110 are included in the memory device 100. In the memory device 100, a plurality of memory cell strings are formed. Each of the memory cell strings can be formed based on a respective channel region and the word lines. It should be noted that FIG. 1 is merely an example, and the memory device 100 can include any number of word lines, insulating layers, and channel structures according to the technology requirements. The memory device 100 can also include other components, such as common source regions, bit lines, word line contacts etc. that are not shown in FIG. 1.

Still referring to FIG. 1, the channel structures can include a channel layer. In a related memory device, the channel layer is made of a high quality and thin poly silicon (Si). The poly Si can cause a negative Uvvt (also referred to an initial threshold voltage) of the memory device 100. In the present disclosure, a high-k layer is arranged over the channel layer in the channel structures. The high-k layer can result in a formation of a plurality of electric dipoles, which in turn can affect the Uvvt of the memory device. For simplicity and clarity, discussions in subsequent sections are based on the channel structure 104.

Figure 2A:
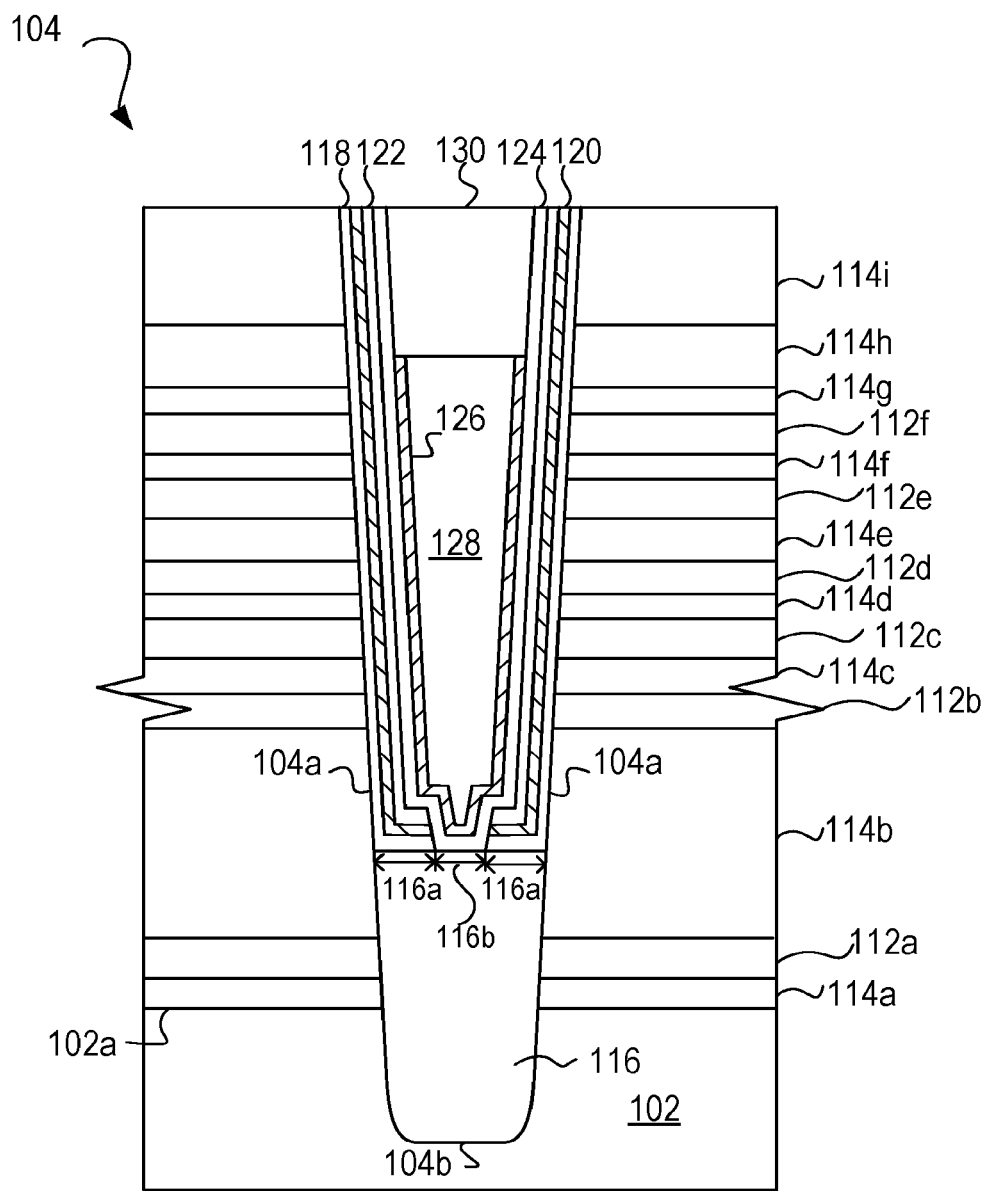
FIG. 2A is a first cross-sectional view of an exemplary channel structure in a disclosed 3D NAND memory device, in accordance with some embodiments.

FIG. 2A is a first cross-sectional view of an exemplary channel structure 104, which provides a first configuration of the channel structure 104. As shown in FIG. 2A, the channel structure 104 vertically protrudes from a side 102a of the substrate 102. The channel structure 104 further extends through the word lines 112 and the insulating layers 114. The channel structure 104 can have a cylindrical shape with sidewalls 104a and a bottom region 104b. Of course, other shapes are possible. The channel structure 104 is formed perpendicular to the substrate 102, and electrically coupled with the substrate 102 through a bottom channel contact 116 that is positioned at the bottom region 104b of the channel structure 104.

The channel structure 104 further includes a channel layer 124, a tunneling layer 122, a charge trapping layer 120, and a blocking layer (also referred to as gate dielectric layer, gate barrier layer) 118. The blocking layer 118 is formed along the sidewalls 104a of the channel structure 104 and covering a first portion 116a of the bottom channel contact 116. The blocking layer 118 can be in direct contact with the word lines 112a-112f and the insulating layers 114a-114i. The charge trapping layer 120 is formed over the blocking layer 118. The charge trapping layer 120 has side portions along the sidewalls 104a and a bottom portion over the bottom channel contact 116. The tunneling layer 122 is formed over the charge trapping layer 120. The tunneling layer 122 has side portions along the sidewalls 104a and a bottom portion over the bottom channel contact 116.

The channel layer 124 has side portions that are formed along the tunneling layer 122 and has a T-shape bottom portion that extends through the bottom portions of the tunneling layer 122, the charge trapping layer 120, and the blocking layer 118 that are positioned over the bottom channel contact 116. The T-shape bottom portion of the channel layer 124 further is positioned over a second portion 116b of the bottom channel contact 116 so that the channel layer 124 is in contact with the bottom channel contact 116. In addition, the tunneling layer 122, the charge trapping layer 120, and the blocking layer 118 can form an "L-foot" configuration in the channel structure 104. The L-foot configuration can include side portions that are formed along the sidewalls 104a of the channel structure and a bottom portion positioned over the bottom channel contact 116.

The channel structure 104 can also include a high-k layer 126 that is formed over the channel layer 124. As shown in FIG. 2A, the high-k layer 126 can have side portions long the sidewalls 104a and a bottom portion over the bottom channel contact 116. In the channel structure 104, a channel insulating layer 128 is formed over the high-k layer 126 to fill the channel structure 104. The channel structure 104 can further include a top channel contact 130 that is arranged along the channel layer 124 and positioned over the high-k layer 126 and the channel insulating layer 128. In some embodiment, the top channel contact 130 is positioned above the word line 112f to prevent any electrical interference between the top channel contact 130 and the word line 112f. In some embodiment, a gate dielectric layer (not shown) is further formed between the word line 112a and the bottom channel contact 116. The gate dielectric layer (not shown) can be positioned between the insulating layer 114a and 114b, and have an annular shape to surround the bottom channel contact 116.

Figure 2B:
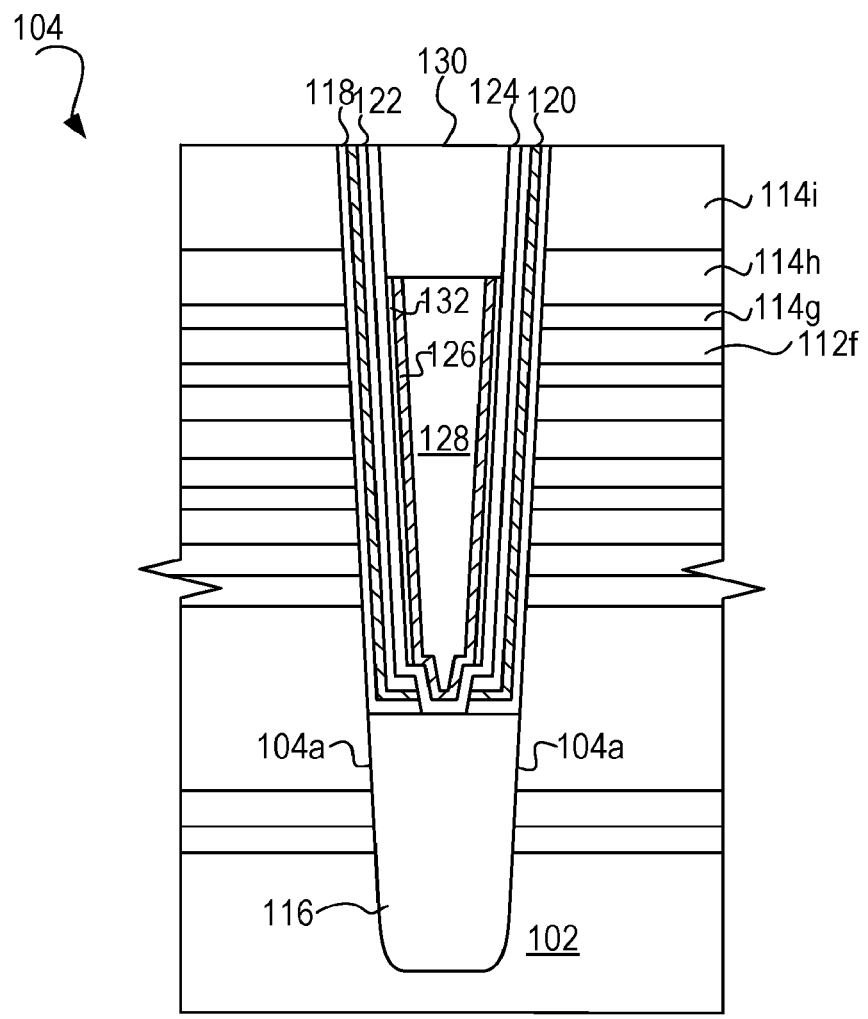
FIG. 2B is a second cross-sectional view of an exemplary channel structure in a disclosed 3D NAND memory device, in accordance with some embodiments.

FIG. 2B is a second cross-sectional view of the channel structure 104, which provides a second configuration of the channel structure 104. Comparing with the first cross-sectional view of the channel structure 104 in FIG. 2A, a dielectric layer 132 is formed over the channel layer 124 along the sidewalls 104a of the channel structure 104. The high-k layer 126 is then positioned over the dielectric layer 132 so that the dielectric layer 132 is arranged between the high-k layer 126 and the channel layer 124. In some embodiments, an entire high-k layer 126 is spaced apart from the channel layer 124 by the dielectric layer 132, which can be shown in FIGS. 12A and 12B. In some embodiments, as shown in FIG. 2B, only portions of the high-k layer 126 and the channel layer 124 are separated by the dielectric layer 132. For example, as shown in FIG. 2B, side portions of the high-k layer formed along the sidewalls 104a are spaced apart from the channel layer 124 by the dielectric layer 132, and the bottom portion of the high-k layer 126 over the bottom channel contact is in contact with the channel layer 124.

Figure 2C:
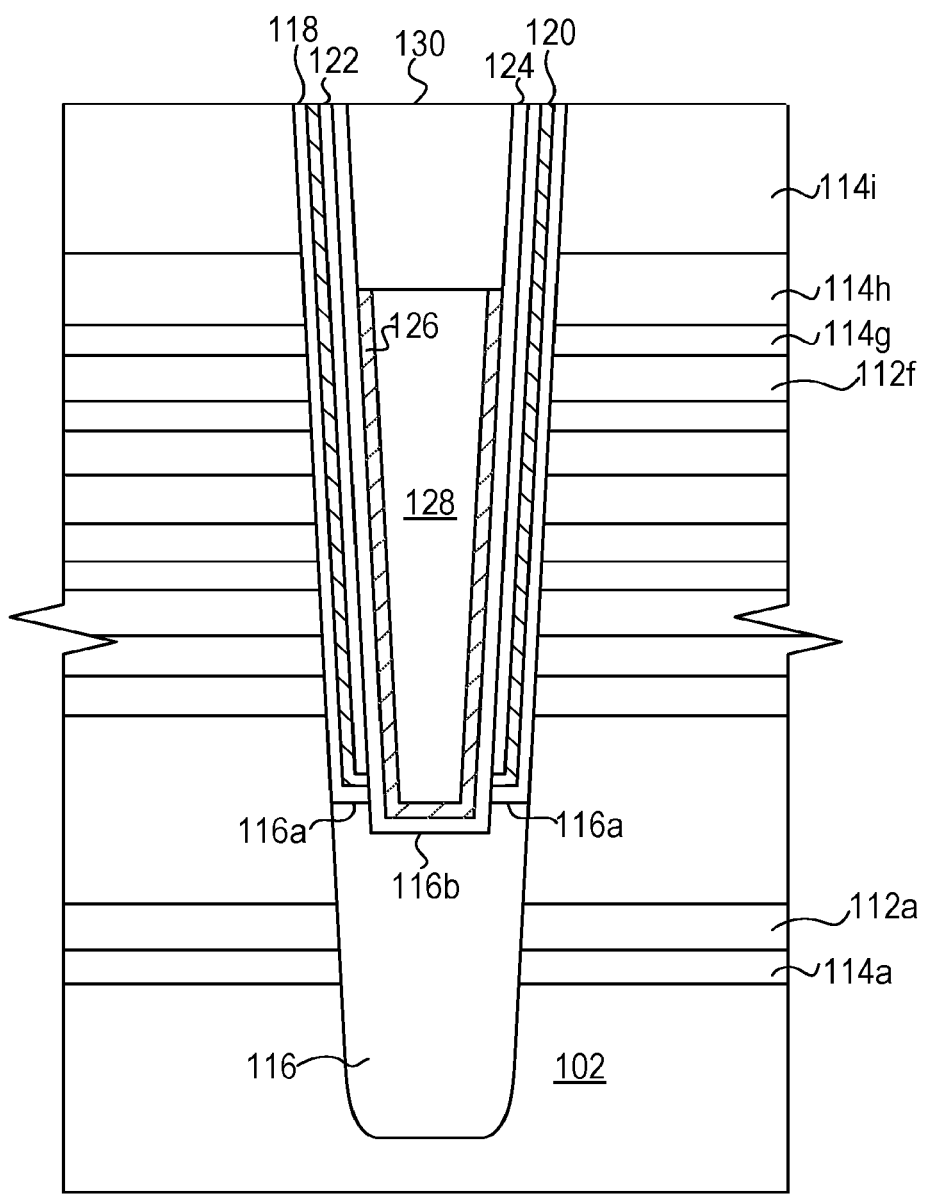
FIG. 2C is a third cross-sectional view of an exemplary channel structure in a disclosed 3D NAND memory device, in accordance with some embodiments.

FIG. 2C is a third cross-sectional view of an exemplary channel structure 104, which provides a third configuration of the channel structure 104. Comparing with the first cross-sectional view of the channel structure 104 in FIG. 2A, the channel layer 124 and the high-k layer 126 have U-shape bottom portions that extend into the bottom channel contact 116. As shown in FIG. 2C, the blocking layer 118, the charge trapping layer 120, and the tunneling layer 122 are arranged over a first top surface 116a of the bottom channel contact 116. The blocking layer 118, and the charge trapping layer 120 can have bottom portions with a "L-foot" configuration. The channel layer 124 and high-k layer 126 extend through the bottom portions of the blocking layer 118, the charge trapping layer 120, and the tunneling layer 122, further extend into the bottom channel contact 116, and are positioned over a second top surface 116b of the bottom channel contact 116. As shown in FIG. 2C, the second top surface 116b is positioned below the first top surface 116a.

In an embodiment of FIGS. 2A and 2B, the blocking layer 118 is made of $SiO_2$. In another embodiment, the blocking layer 118 can include multiple layers, such as $SiO_2$ and $Al_2O_3$. In an embodiment, the charge trapping layer 120 can be made of SiN. In another embodiment, the charge trapping layer 120 can include a multi-layer configuration, such as a SiN/SiON/SiN multi-layer configuration. In some embodiments, the tunneling layer 122 can include a multi-layer configuration, such as a SiO/SiON/SiO multi-layer configuration. In an embodiment of FIGS. 2A and 2B, the channel layer 124 is made of polysilicon via a furnace low pressure chemical vapor deposition (CVD) process. The channel insulating layer 128 and the dielectric layer 132 can be made of $SiO_2$, or the other suitable dielectric materials. The top and bottom channel contacts 116 and 130 can be made of polysilicon.

In some embodiments, the word lines 112 illustrated in FIGS. 2A-2C are formed directly by using materials with characteristics of conductivity, low resistance, simple fabrication, and no reaction with adjacent components. For example, the word lines 112 can be made of polysilicon. In some embodiments, the word lines 112 can be made by using sacrificial layers at first. The sacrificial layers can be removed and replaced with a high K material and a metal layer. The sacrificial layer can be made of materials which can provide selective etching. The selective etching can refer to etching the sacrificial layers 112 without etching the insulating layer 114. In addition, the materials do not react with the insulating layers 114, and have little effect on stress during subsequent high temperature treatments. Exemplary materials to make the sacrificial layers can be SiN, SiON, SiCN, or the like. The high K material can be made of aluminum oxide, hafnium oxide, or the like. The metal layer can be made of tungsten (W), ruthenium, cobalt, or other suitable conductive materials. The insulating layers 114 can be made of $SiO_2$, or other suitable dielectric materials. In some embodiments, the insulating layer 114h can have different density or quality from other insulating layers according to the process requirements.

Still referring to FIGS. 2A-2C, the channel structure 104 can have a cylindrical shape. However, the present disclosure is not limited thereto, and the channel structures 104 may be formed in other shapes, such as a square pillar-shape, an oval pillar-shape, or any other suitable shapes.

Figure 3:
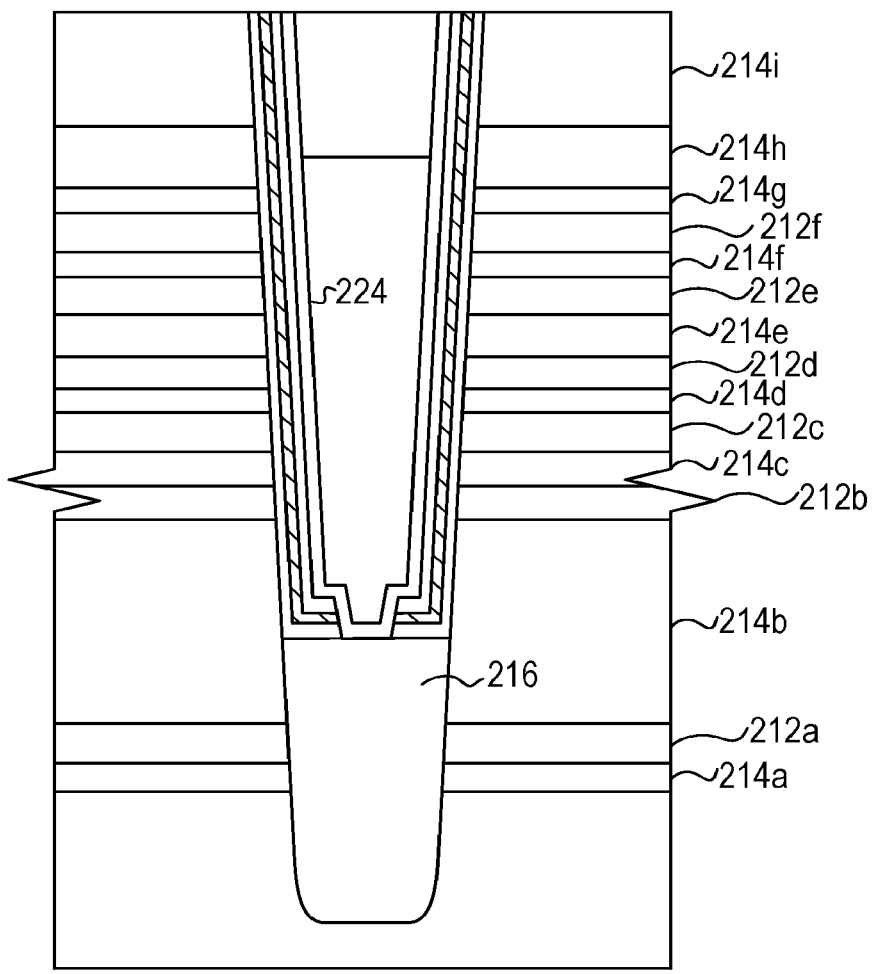
FIG. 3 is a cross-sectional view of an exemplary channel structure in a related 3D NAND memory device, in accordance with some embodiments.

FIG. 3 is a cross-sectional view of a related 3D NAND memory device, where a channel structure 200 is provided. Comparing to the channel structure 104 in FIG. 2A or FIG. 2B, the channel structure 200 does not have a high-k layer formed over the channel layer 224. As mentioned above, the channel layer 224 is made of a high quality and thin poly silicon (Si). The poly Si can cause a negative Uvvt for the related memory device. The Uvvt of the memory device can be tuned by adjusting a thickness of the poly Si. However, a series of parameters, such as Ion (on current), SS (subthreshold voltage) can be affected due to the adjusted poly Si thickness.

In the present disclosure, a high-k layer (e.g., high-k layer 126) is arranged over the channel layer in the channel structure. The high-k layer can result in a formation of a plurality of electric dipoles, which in turn can affect the Uvvt of the memory cell. The high-k layer can be made of a first material that provides positive electric dipoles and increases the Uvvt, or a second material that provides negative electric dipoles and reduces Uvvt of the memory device. In some embodiments, the first material can include $HfO_2$, $Al_2O_3$, or the like. The second material can include $La_2O_3$, $Y_2O_3$, or the like. Moreover, an increased thickness of the high-k layer results in a larger change of the initial threshold voltage (Uvvt) of the memory device. When the high-k layer of the first material is introduced, the Uvvt can be increased. Therefore, in order to meet a same target threshold voltage, a less number of charges are required, which accordingly improves a program speed of the memory device. In addition, a band bending during a data retention is reduced. A reduced band bending can weaken a charge escaping capacity and improve the data retention. When the high-k layer of the second material is introduced, the Uvvt can be reduced, and an erase speed can be increased, which in turn reduces an erase stress time, and improves an endurance characteristic and a 3K (i.e., 3000 cycling) retention.

FIG. 4 shows a change of an energy bandgap in the channel structure when the high-k layer is introduced, where the high-k layer is made of the first material. As shown in FIG. 4, before the high-k layer is introduced, the channel structure (e.g., channel structure 104) can have a bandgap 401 of the tunneling layer, a bandgap 402 of the charge trapping layer, a bandgap 403 of the blocking layer, and a bandgap 404 of the word line. It should be noted that the bandgaps 401-404 have different gaps because the tunneling layer, the charge trapping layer, the blocking layer, and the word line have different material properties. Still in FIG. 4, when the high-k layer is introduced, the bandgap 401 of the tunneling layer becomes a bandgap 401' that has a less band bending. Similarly, the bandgap of blocking layer 403 becomes a bandgap 403' that has a less band bending due to the high-k layer of the first material. As mentioned above, a reduced band bending can weaken a charge escaping capacity and improve the data retention.

FIGS. 5A-5B are energy band diagrams that show an effect of an electrical dipole on an effective work function of a metal gate (e.g., word line in the memory device) in the channel structure. FIG. 5A is an energy band diagram at an equilibrium state when an electric dipole is not introduced. FIG. 5B is an energy band diagram at an equilibrium state when a positive electric dipole 502 is introduced at an interface of a high-k layer and a $SiO_2$ layer (e.g., a blocking layer, a gate dielectric layer). As shown in FIG. 5B, a solid line 506 is a fermi level of the metal gate and a dash line 504 is a fermi level of the metal gate after the positive electric dipole is introduced. FIG. 5C is an energy band diagram at an equilibrium sate when a negative electric dipole 508 is introduced at an interface of a high-k layer and a $SiO_2$ layer. As shown in FIG. 5C, a solid line 510 is a fermi level of the metal gate and a dash line 512 is a fermi level of the metal gate after the negative electric dipole is introduced. Introducing an electric dipole is equivalent to changing an effective work function of the metal gate, which in turn changes the Uvvt of the memory device.

Figure 6A:
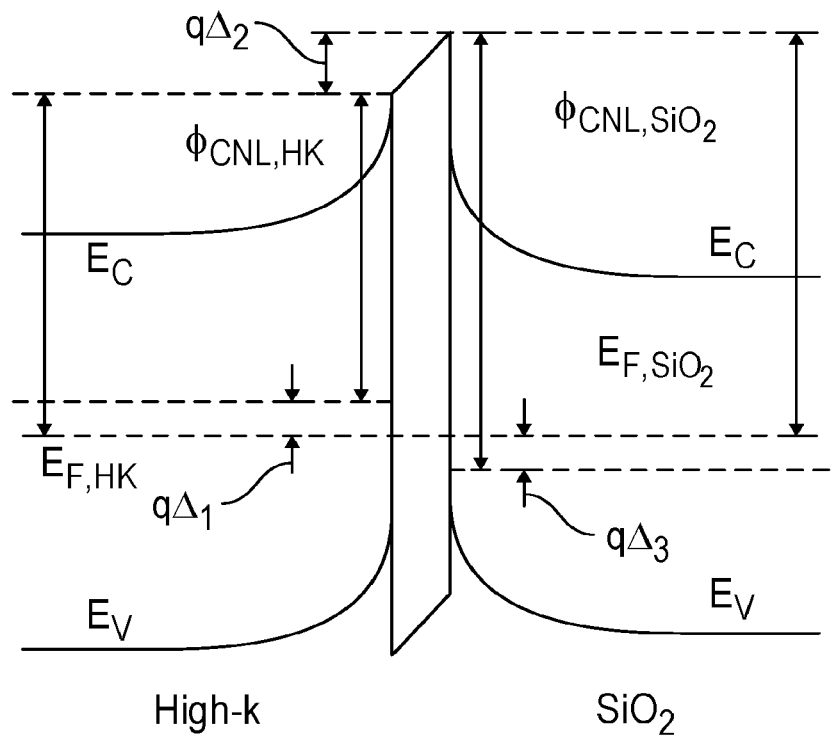
FIG. 6A is an energy band diagram of a positive electric dipole at a high-k gate dielectric/$SiO_2$ interface, in accordance with some embodiments.
Figure 6B:
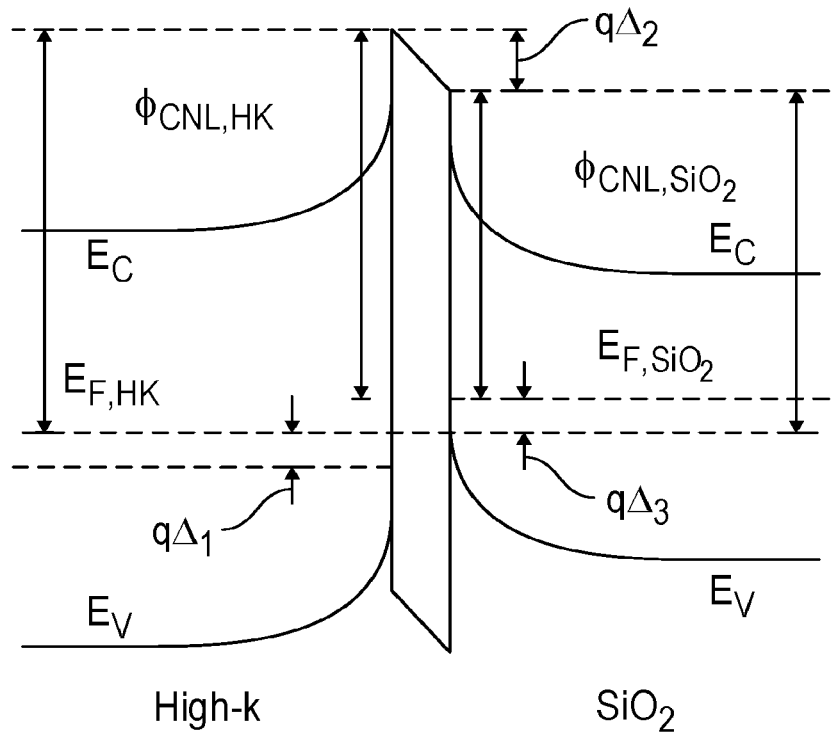
FIG. 6B is an energy band diagram of a negative electric dipole at a high-k gate dielectric/$SiO_2$ interface, in accordance with some embodiments.

FIG. 6A is an energy band diagram of a positive electric dipole at a high-k gate dielectric/$SiO_2$ interface. FIG. 6A is an energy band diagram of a positive electric dipole at a high-k gate dielectric/$SiO_2$ interface. FIG. 6B is an energy band diagram of a negative electric dipole at a high-k gate dielectric/$SiO_2$ interface. In FIGS. 6A-6B, $q\Delta 1$ is a difference between $E_{f,HK}$ and $\phi_{CNL,HK}$, where $E_{f,HK}$ is a fermi level of the high-k layer, and $\phi_{CNL,HK}$ is a charge neutrality level (CNL) of the high-k layer. In addition, $q\Delta 3$ is a difference between $\phi_{CNL,SiO2}$ and $E_{f,SiO2}$, where $E_{f,SiO2}$ is a fermi level of the $SiO_2$, and $\phi_{CNL,SiO2}$ is a CNL of the $SiO_2$. Further, $q\Delta 2$ is an energy difference between $E_{f,SiO2}$ and $E_{f,HK}$. In FIGS. 6A and 6B, $E_v$ indicates a valence band and $E_c$ indicates a conduction band. According to FIGS. 6A and 6B, an impact of the electric dipole on the Uvvt can be describe by equation (1):

$$V_{FB} = \psi_g - \psi P_{Si} + \Delta Dipole \quad (1)$$

where $V_{FB}$ is a gate voltage at Hatband condition which is indicative of the Uvvt, $\psi_g$ is a work function of the gate (also referred to as word line in the memory device 100), $\psi_{Si}$ is a work function of the channel layer, and $\Delta Dipole$ is a voltage delta introduced by the electric dipole. The $\Delta Dipole$ can be described by equation (2):

$$\Delta Dipole = (\phi_{CNL,SiO2} - \phi_{CNL,HK})/q \quad (2)$$

where $\phi_{CNL,HK}$ is a charge neutrality level (CNL) of the high-k layer, $\phi_{CNL,SiO2}$ is a CNL of the $SiO_2$, and q is a quantity of electricity or charge.

As shown in equation (1), when $\Delta Dipole$ is positive, the $V_{FB}$ is increased. A first material, such as $HfO_2$ or $Al_2O_3$, can result in a positive $\Delta Dipole$. When $\Delta Dipole$ is negative, the $V_{FB}$ is reduced. A second material, such as $La_2O_3$ or $Y_2O_3$, can result in a negative $\Delta Dipole$. In addition, an increased thickness of the high-k layer can introduce more electric dipoles, which result in a larger $V_{FB}$ change.

Figure 7A:
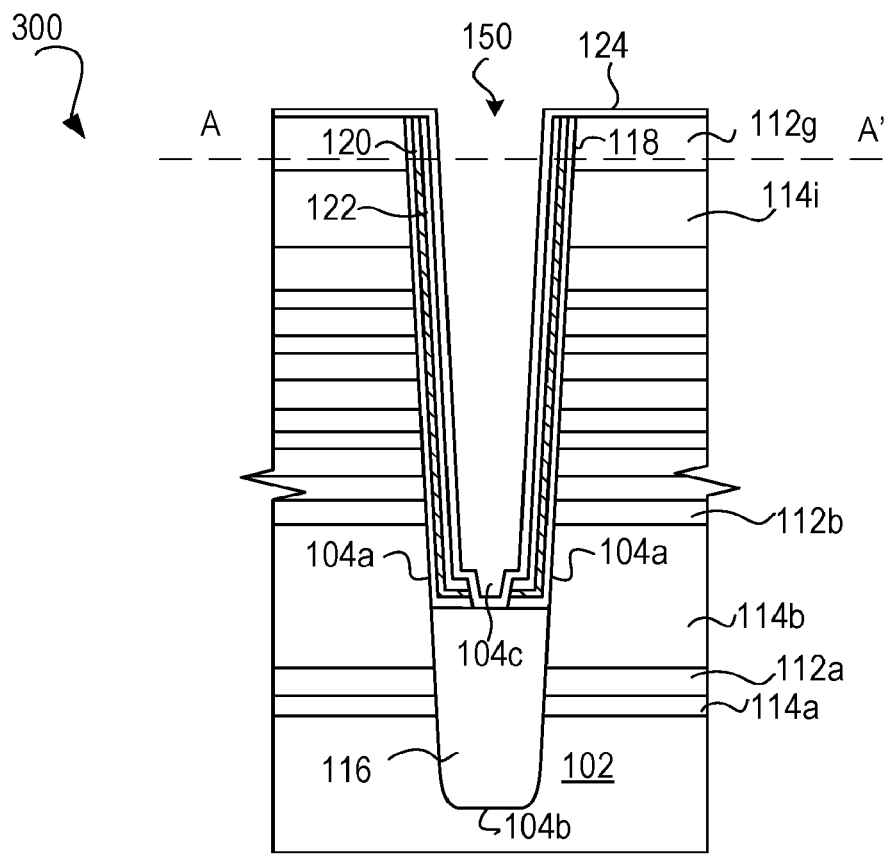
FIGS. 7A, 7B, 8A, 8B, 9A, 9B, 10A, 10B, 11A, 11B, 12A, 12B, 13A, and 13B are cross-sectional and top down views of various exemplary intermediate steps of manufacturing a 3D NAND memory device in accordance with some embodiments.

FIGS. 7A through 13B are cross-sectional and top down views of various intermediate steps of manufacturing a 3D NAND memory device in accordance with some embodiments. As shown in FIG. 7A, a semiconductor structure 300 is prepared through a variety of semiconductor processing techniques, such as photolithography, chemical vapor deposition (CVD), physical vapor deposition (PVD), dry etching, wet etching, wet clean, diffusion, atomic layer deposition (ALD), chemical mechanical planarization (CMP), ion implantation, metrology, or other suitable techniques. The semiconductor structure 300 has a substrate 102. The substrate 102 may include a silicon (Si) substrate, a germanium (Ge) substrate, a silicon germanium (SiGe) substrate, and/or a silicon-on-insulator (SOI) substrate. The substrate 102 may include a semiconductor material, for example, a Group IV semiconductor, a Group III-V compound semiconductor, or a Group II-VI oxide semiconductor. The substrate 102 may be a bulk wafer or an epitaxial layer. In the embodiment of FIG. 7A, substrate 102 is a Group IV semiconductor that may include Si, Ge, or SiGe.

The semiconductor structure 300 also includes a plurality of word lines 112a-112g, and a plurality of insulating layers 114a-114i that separate the word lines from each other. A channel opening 150 is formed to pass through the plurality of word lines and the plurality of insulating layers, and further extends into the substrate 102. The channel opening 150 can have sidewalls 104a and a bottom region 104b to expose the substrate 102. The channel opening 150 can be formed by a pattering process, where a pattern can be formed in a mask layer (not shown) through a photolithography process and a subsequent etching process transfers the pattern into the word lines and the insulating layers to form the channel opening 150.

Still referring to FIG. 7A, a bottom channel contact 116 can be formed at the bottom region 104b of the channel opening 150. The bottom channel contact can be formed along the sidewalls 104a of the channel opening 150 and further extends into the substrate 102. Any suitable process can be applied to form the bottom channel contact, such as CVD process, a diffusion process, an epitaxial growth process, or other suitable processes. The bottom channel contact 116 can be made of Si doped with n-type dopant.

A blocking layer 118 can be formed along the sidewalls of the channel opening and over the bottom channel contact 116. The blocking 118 layer has side portions along the sidewalls 104a of the channel opening 150 and a bottom portion covering the bottom channel contact 116. A charge trapping layer 120 can be formed over the blocking layer 118. The charging trapping layer 120 has side portions along the sidewalls of the channel opening 150 and a bottom portion over the bottom channel contact. A tunneling layer 122 can be formed over the charge trapping layer. The tunneling layer 122 also has side portions along the sidewalls 104a of the channel opening 150 and a bottom portion over the bottom channel contact 116.

A bottom opening 104c can then be formed by an etching process. The bottom opening 104c extends through the bottom portions of the blocking layer 118, the charge trapping layer 120, and the tunneling layer 122 to expose the bottom channel contact 116. Subsequently, a channel layer 124 can be deposited into the channel opening 150. The channel layer 124 can be formed over the tunneling layer 122 along the sidewalls of the channel opening 150. The channel layer 124 further passes through the bottom opening 104c so that the channel layer 124 extends through the bottom portions of the blocking layer 118, the charge trapping layer 120, and the tunneling layer 122 to contact the bottom channel contact 116. The channel layer 124 can also cover a top surface of the word line 112g during the formation. Any suitable process can be applied to form the channel layer 124, such as a CVD process, a diffusion process, and an ALD process.

In some embodiments, in order to deposit the channel layer 124, a dummy or protecting channel layer (not shown) can be formed over the tunneling layer 122 firstly. The dummy channel layer can have side portions along the sidewalls of the channel opening, and a bottom portion over the bottom channel contact. A subsequent punch etching step can be applied to form the bottom opening the extends through the bottom portions of the blocking layer, the charge trapping layer, the tunneling layer, and the dummy channel layer. The punch etching step can also etch the side portions of the dummy channel layer during the formation of the bottom opening. The channel layer 124 can then be deposited over the dummy channel layer.

In some embodiments, an annealing process can be applied after the deposition of the channel layer 124. The annealing process can improve a crystallization of the channel layer 124 and reduce a resistivity of the channel layer.

Figure 7B:
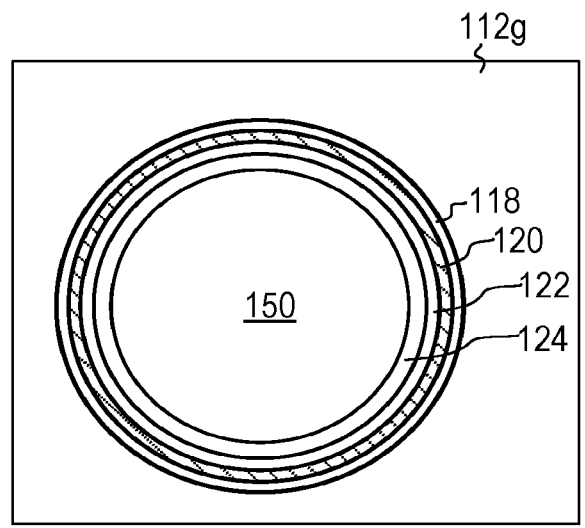

FIG. 7B is a top down view of the semiconductor structure 300 after the channel layer 124 is formed. FIG. 7B is obtained from a line A-A' along a direction parallel to the substrate in FIG. 7A.

Figure 8A:
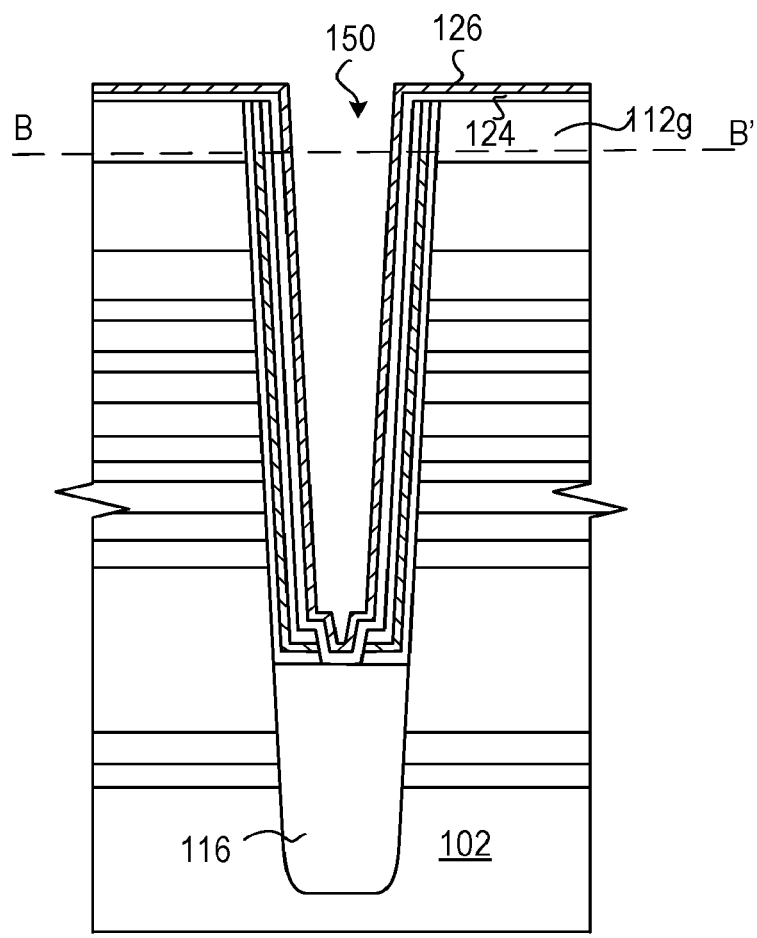
Figure 8B:
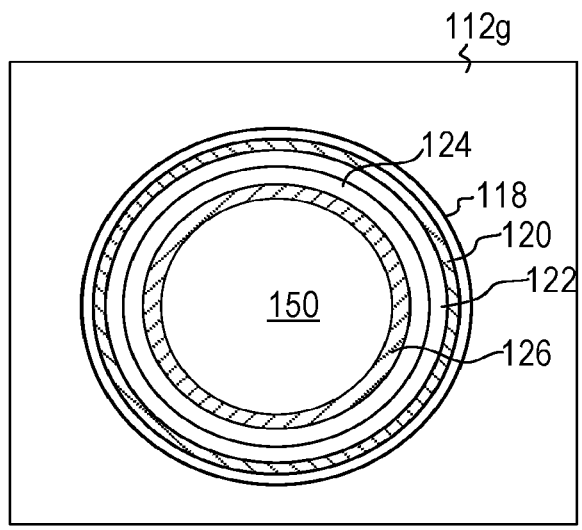

In FIG. 8A, a high-k layer 126 can be deposited over the channel layer 124 along the sidewalls of the channel opening. The high-k layer 126 further passes through the bottom opening 104c so that the high-k layer 126 can be positioned over the bottom channel contact 116. The high-k layer 126 can also be deposited over the top surface of the word line 112g. The high-k layer 126 can include a first material which includes $HfO_2$, $Al_2O_3$, or the like, and a second material which includes La2O3, Y2O3, or the like. The high-k layer 126 can be formed through a CVD process, a diffusion process, an ALD process, a PVD process, or other suitable processes. FIG. 8B is a top down view after the high-k layer 126 is formed, which is obtained from a line B-B' along a direction parallel to the substrate in FIG. 8A.

Figure 9A:
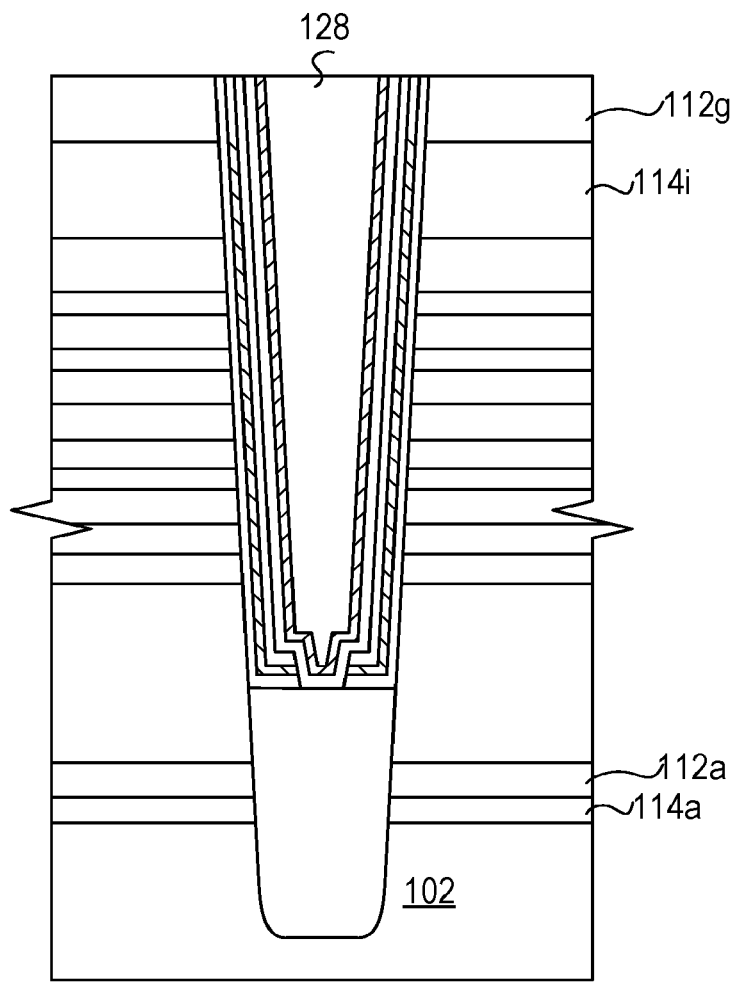
Figure 9B:
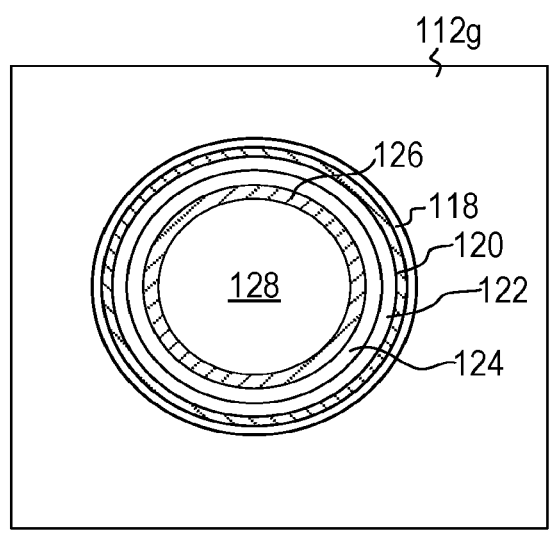

In FIG. 9A, a channel insulating layer 128 can be subsequently deposited to fill in the channel opening 150. A surface planarization process, such as a CMP process or an etch back process, can be applied to remove any excessive insulation layer 128, excessive channel layer 124, and excessive high-k layer 126 from a top surface of the word line 112g. FIG. 9B is a top down view when the surface planarization process is completed.

Figure 10A:
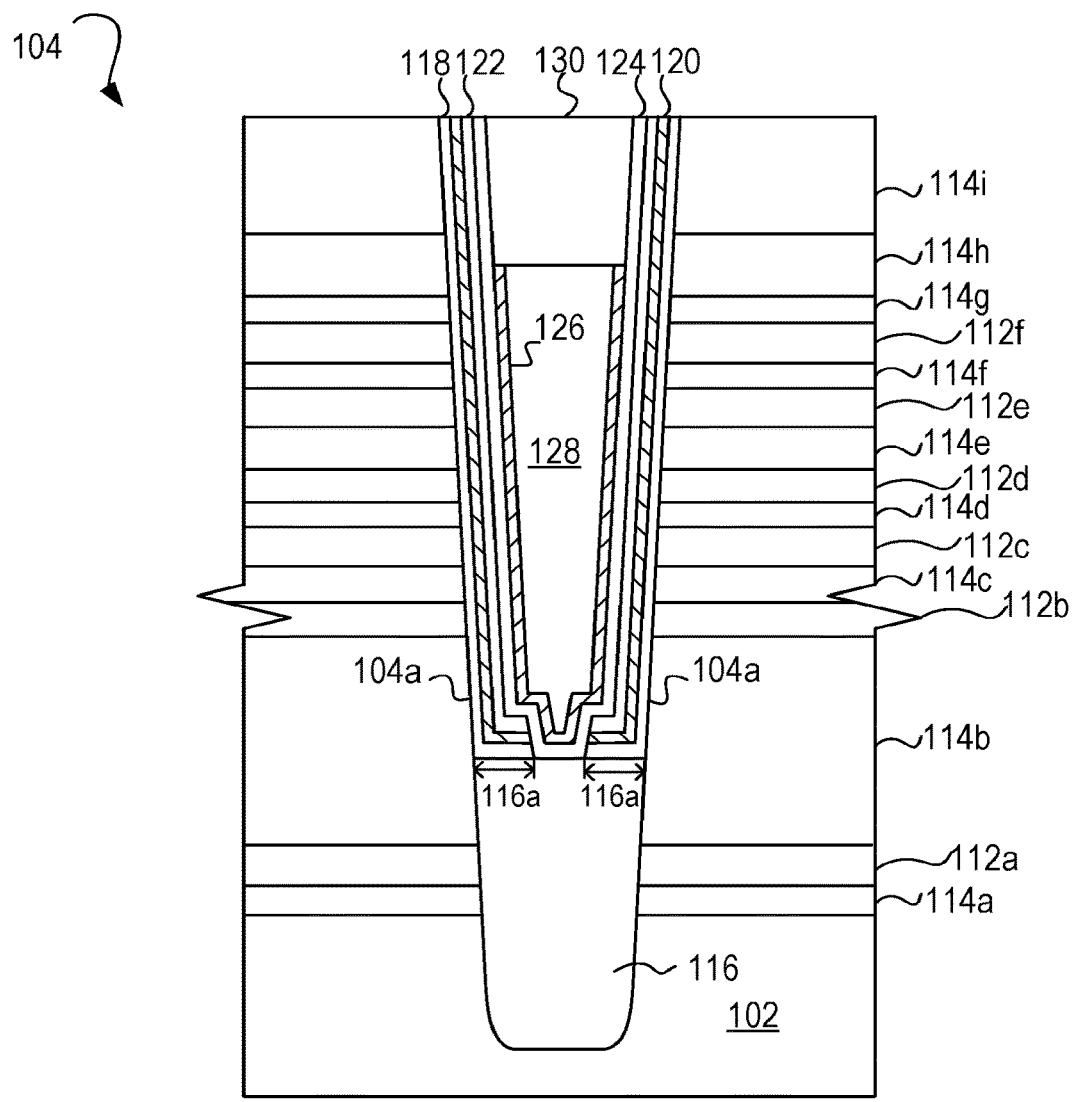

In FIG. 10A, a top opening (not shown) can be formed to remove a portion of the channel insulating layer 128 and a portion of the high-k layer 126. The top opening can be formed along the channel layer 124, and extend into a position between the insulating layer 114i and 114g. In order to form the top opening, a mask layer (not shown) can be positioned over the word line 112g (referring to FIG. 9) and channel insulating layer 128. A pattern can be formed through a photolithography process, and the pattern can then be transferred into the insulating layer 128 by an etching process to form the top opening. Further, a conductive layer (not shown) can be deposited to fill the top opening. The conductive layer can be tungsten, copper, ruthenium, cobalt, aluminum, or other suitable conductive materials. The conductive layer can be formed through a CVD process, a PVD process, a diffusion process, an electroplating process, or other suitable processes. A surface planarization, such as a CMP process or an etching back process, can subsequently be applied to remove any excessive conductive layer. The surface planarization can further remove the word line 112g and stop on the insulating layer 114i. The conductive layer remains in the top opening becomes the top channel contact 130.

Figure 10B:
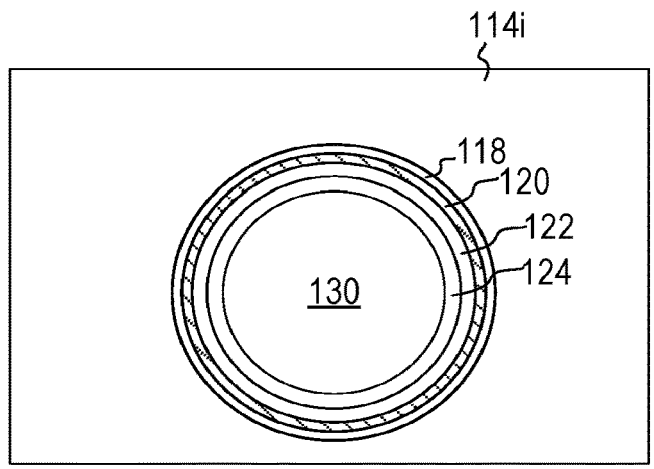

After the surface planarization is completed, a channel structure 104 that is similar to the channel structure 104 in FIG. 2A is formed. As shown in FIG. 10A, the channel structure 104 in FIG. 10A has similar configurations to the channel structure 104 in FIG. 2A. For example, the channel structure 104 extends through the word lines 112a-112f, and the insulating layer 114a-114i. The channel structure 104 has the bottom channel structure 116 that extends into the substrate 102. The high-k layer 126 is formed over the channel layer 124 along the sidewalls 104a of the channel structure, and further positioned over the bottom channel contact 116. FIG. 10B is a top down view of the channel structure 104.

Figure 11A:
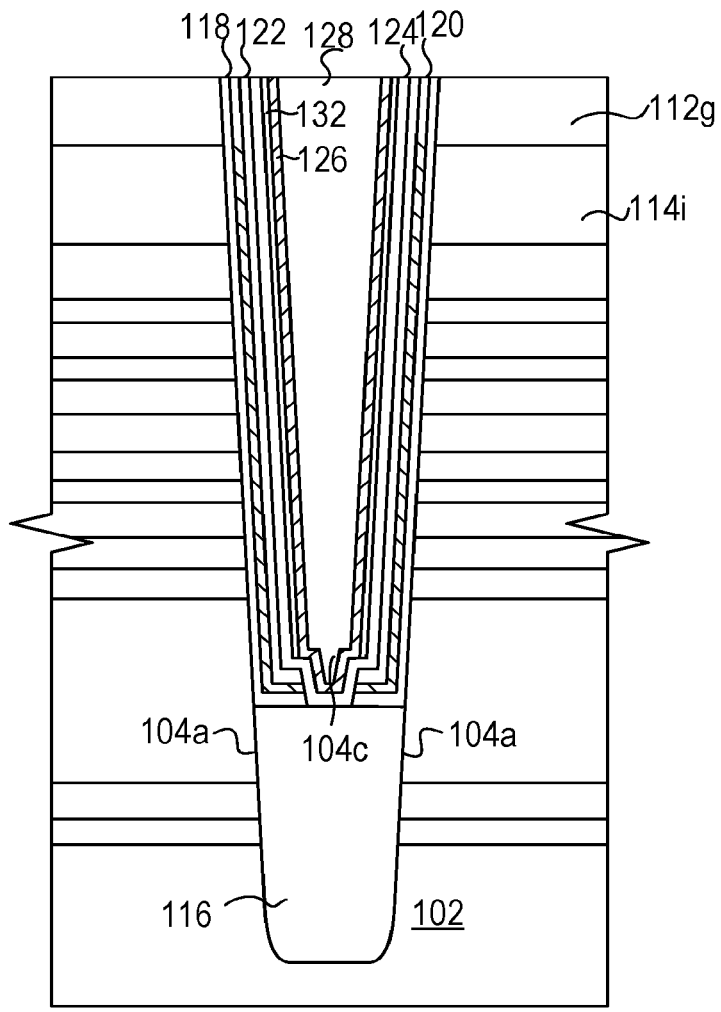

FIGS. 11A-12B illustrates intermediate steps to form the channel structure 104 that is shown in FIG. 2B. Referring back to FIG. 7A, after the channel layer 124 is formed, a dielectric layer 132 can be deposited into the channel opening 150 so that the dielectric layer 132 is formed over the channel layer 124. In an embodiment, the dielectric layer 132 is formed along the sidewalls of the channel layer 124 selectively, and the dielectric layer 132 does not cover the bottom opening 104c. The high-k layer 126 is then formed over the dielectric layer 132 and further passes through the bottom opening 104c. Therefore, the dielectric layer 132 is positioned between the high-k layer 126 and the channel layer 124. In addition, as shown in FIG. 11A, side portions of the high-k layer 126 along the sidewalls 104a of the channel opening 150 is separated from the channel layer 124 by the dielectric layer 132, and a bottom portion of the high-k layer 126 over the bottom channel contact 116 is in contact with the channel layer 124.

Figure 12A:
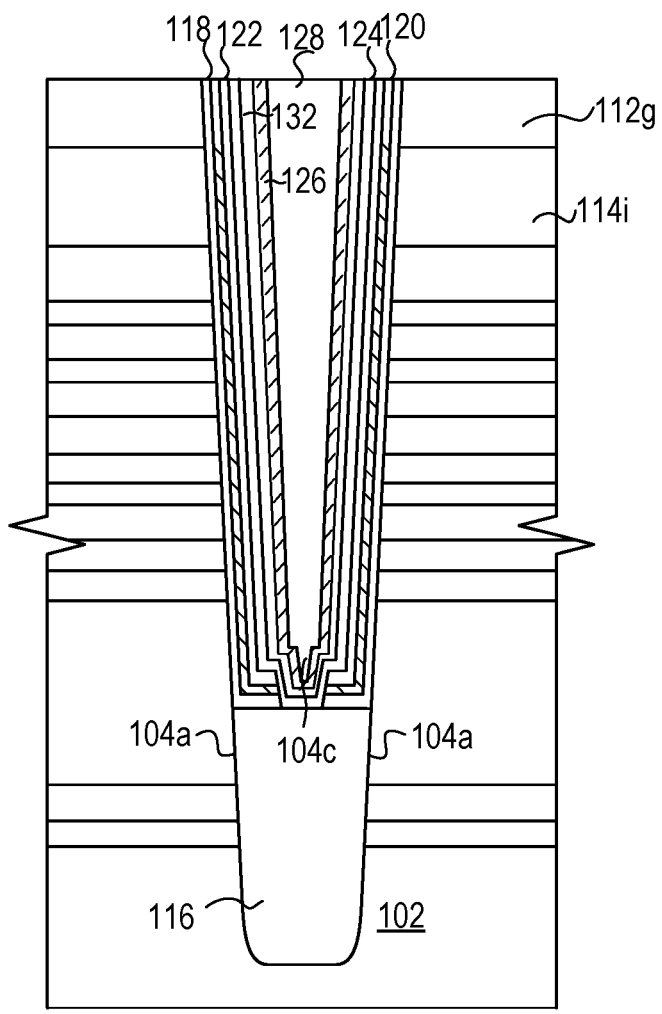

In another embodiment, as shown in FIG. 12A, the dielectric layer 132 can be formed over the channel layer 124 along the sidewalls 104a, and further pass through the bottom opening 104c. Accordingly, an entire high-k layer 126 is spaced apart from the channel layer 124 by the dielectric layer 132.

Figure 11B:
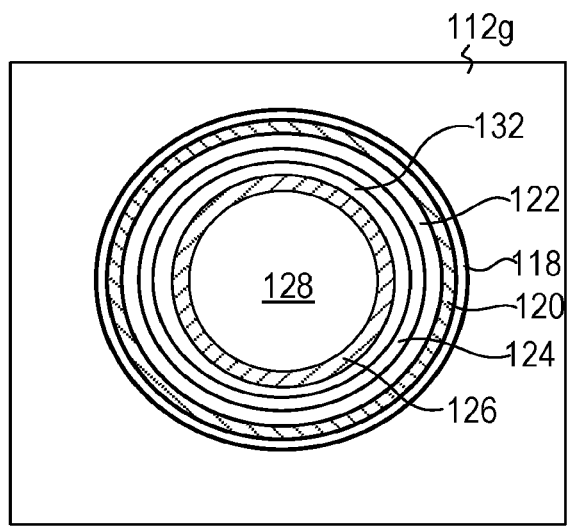
Figure 12B:
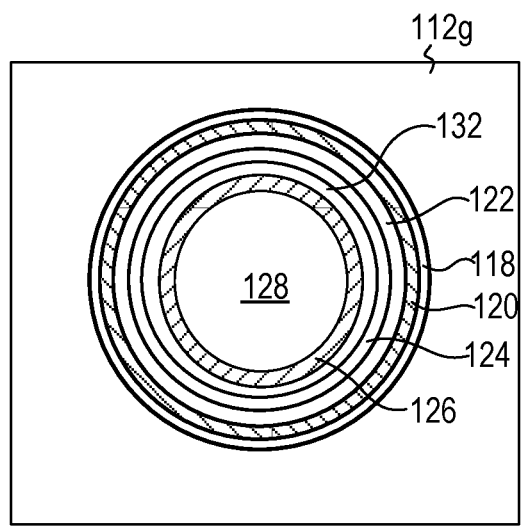

Still in FIGS. 11A and 12A, the channel insulating layer 128 can be deposited in the channel opening 150, and a subsequent surface planarization process can be applied to remove any excessive channel insulating layer 128, excessive high-k layer 126, and excessive channel layer 124. FIGS. 11B and 12B are the top down views when the surface planarization process is completed.

Figure 13A:
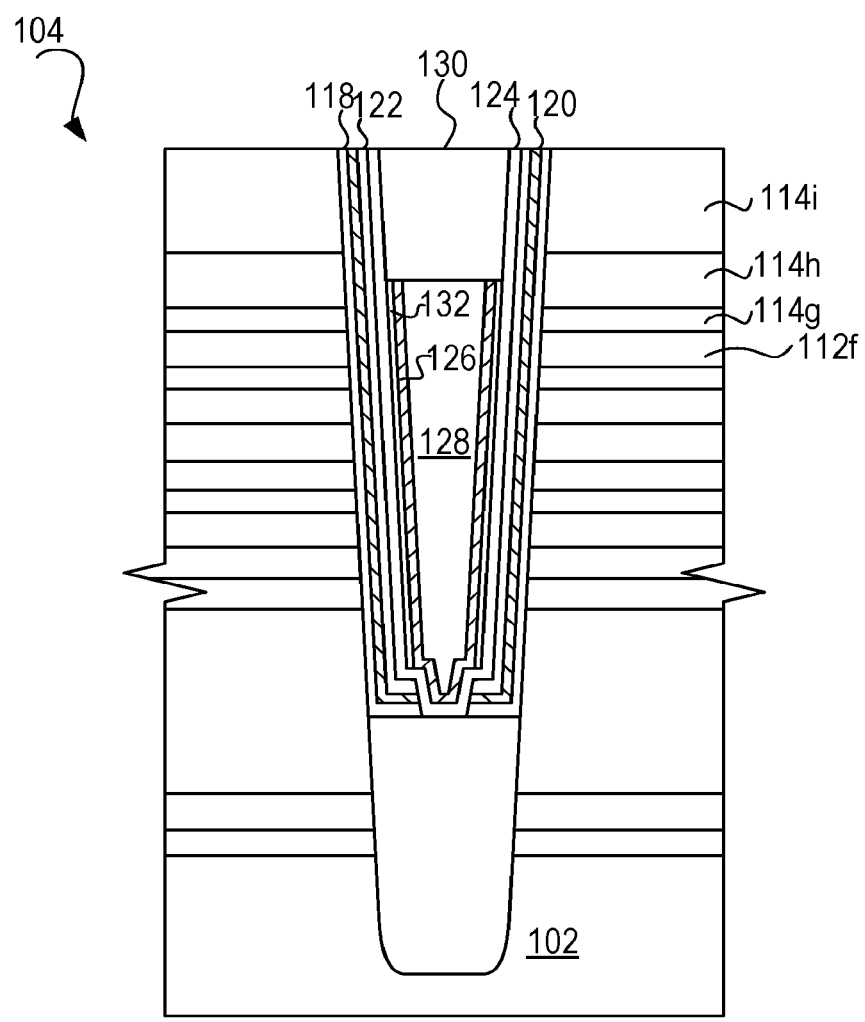
Figure 13B:
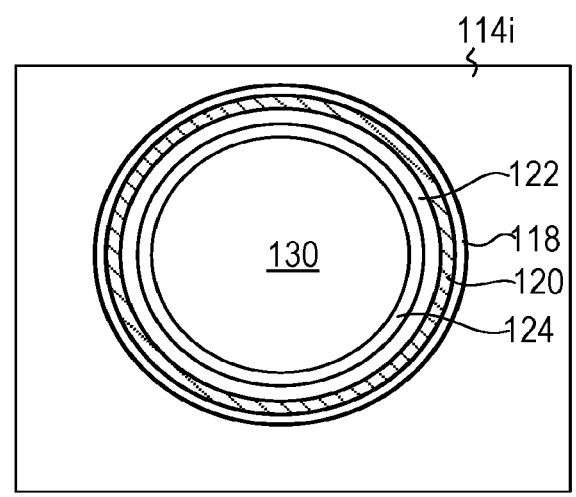

In FIG. 13A, similar to FIG. 10A, a top opening (not shown) can be formed. The top opening removes a portion of the channel insulating layer 128, a portion of the dielectric layer 132, and a portion of the high-k layer 126. A conductive layer (not shown) can be formed to fill the top opening. A surface planarization is applied to remove any excessive conductive layer and further remove the word line 112g. When the surface planarization is completed, a channel structure 104 is formed that is similar to the channel structure 104 in FIG. 2B.

It should be noted that in order to make the channel structure illustrated in FIG. 2C, the bottom opening 104c shown in FIG. 7A can be formed to extend further into the bottom channel contact 116. Accordingly, the blocking layer 118, the charge trapping layer 120, and the tunneling layer 122 are arranged over the first top surface 116a of the bottom channel contact 116. The channel layer 124 can be subsequently formed over the tunneling layer 122 and through the bottom opening 104c. Accordingly, the channel layer 124 extends through the bottom portion of the blocking layer 118 and the charge trapping layer 120, and further extend into the bottom channel contact 116 so that the channel layer 124 is positioned over the second top surface 116*b* of the bottom channel contact 116.

Figure 14:
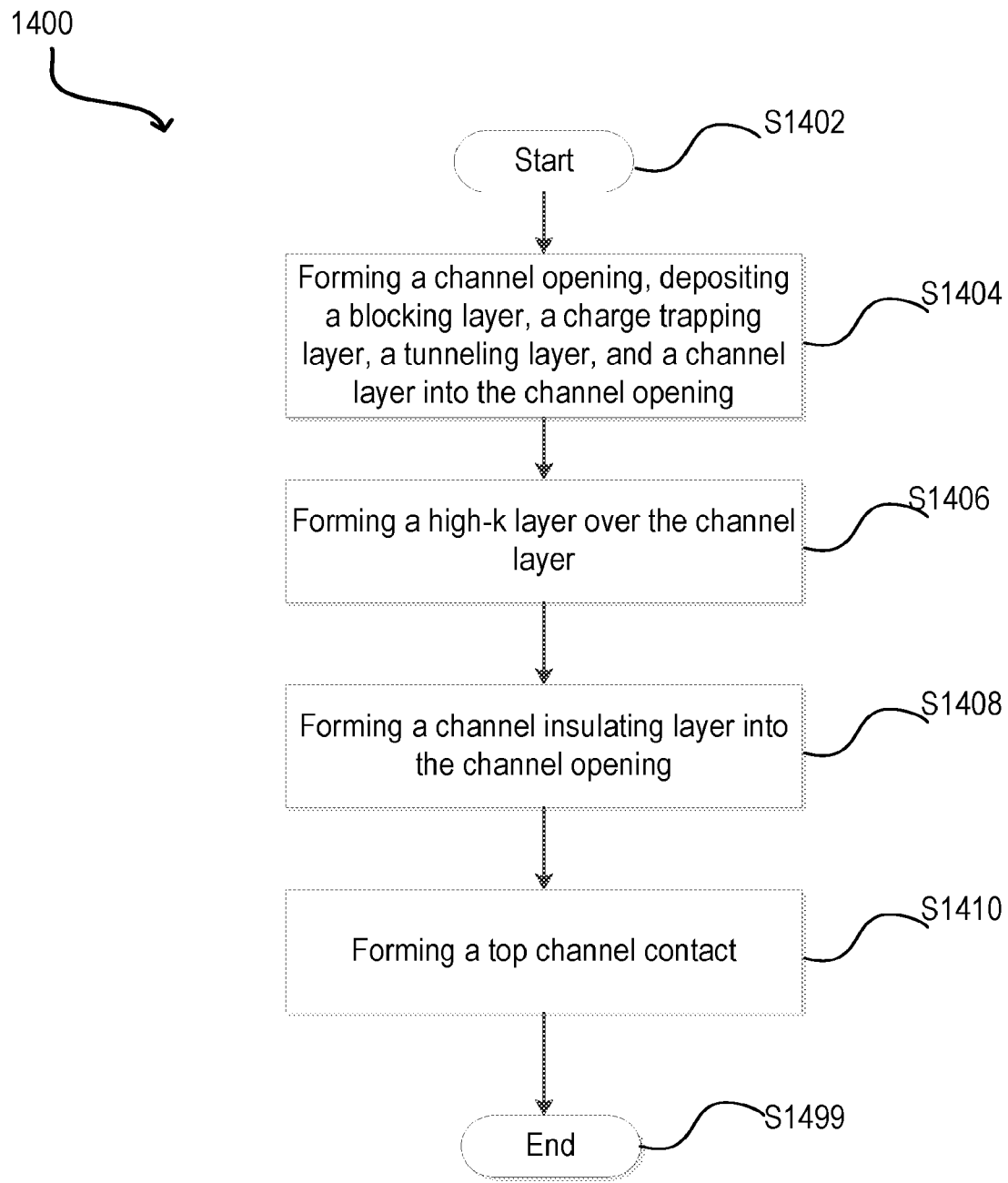
FIG. 14 is a flowchart of a process for manufacturing a 3D NAND memory device, in accordance with some embodiments.

FIG. 14 is a flowchart of a process 1400 for manufacturing a 3D NAND memory device in accordance with some embodiments. The process 1400 begins at step 1404, where a channel opening can be formed. The channel opening can extend through a plurality of word lines and a plurality of insulating layers that are formed over a substrate. The channel opening can have sidewalls and a bottom region that extend into the substrate. A bottom channel contact can be formed at the bottom region of the channel opening. A blocking layer, a charge trapping layer, and a tunneling layer can be deposited into the channel opening along the sidewalls and over the bottom channel contact sequentially. A bottom opening can be formed and a channel layer can be formed over the tunneling layer along the sidewalls, and further through the bottom opening. In some embodiments, step 1404 can be performed as illustrated with reference to FIGS. 7A-7B.

The process 1400 then proceeds to step 1406, where a high-k layer is formed over the channel layer. In a first example, the high-k layer is formed over the channel layer along the sidewalls of the channel opening and further extends through the bottom opening so that the high-k layer is further positioned over the bottom channel contact. In some embodiments, step 1406 can be performed as illustrated with reference to FIGS. 8A-8B.

In a second example, a dielectric layer can be formed over the channel layer at first and then the high-k layer is formed over the dielectric layer. The dielectric layer can be formed along the sidewalls of the channel opening selectively, or the dielectric layer can be formed along the sidewalls of the channel opening and further extend through the bottom opening. In some embodiments, step 1406 in the second example can be performed as illustrated with reference to FIGS. 11A-12B.

The process 1400 proceeds to step 1408 where a channel insulating layer is formed to fill in the channel opening. Step 1408 in the first example can be illustrated in FIGS. 9A-9B, and step 1408 in the second example can be illustrated in FIGS. 11A-12B.

In step 1410, a top channel contact can be formed. The top channel contact can be formed by forming a top opening at first. The top opening is formed by remove a portion of the channel insulating layer, a portion of the high-k layer and a portion of the dielectric layer. A conductive layer is then deposited in the top opening, and a surface planarization process is applied to remove any excessive conductive layer. Step 1410 in the first example can be illustrated in FIGS. 10A-10B, and step 1410 in the second example can be illustrated in FIGS. 13A-13B. When the step 1410 is completed, a channel structure in the 3D NAND memory device is formed.

It should be noted that additional steps can be provided before, during, and after the process 1400, and some of the steps described herein can be replaced, eliminated, or performed in different order for additional embodiments of the process 1400. In subsequent process steps, various additional interconnect structures (e.g., metallization layers having conductive lines and/or vias) may be formed over the semiconductor device 100. Such interconnect structures electrically connect the semiconductor device 100 with other contact structures and/or active devices to form functional circuits. Additional device features such as passivation layers, input/output structures, and the like may also be formed.

The various embodiments described herein offer several advantages over related examples. For example, in the related examples, the Uvvt of the memory device can be tuned by adjusting a thickness of the poly Si. However, a series of parameters, such as Ion (on current), SS (subthreshold slope) can be affected due to the adjusted poly Si thickness. In the present disclosure, a high-k layer is arranged over the channel layer in the channel structure. The high-k layer can result in a formation of a plurality of electric dipoles, which in turn can affect the Uvvt of the memory device. The high-k layer can includes a first material that provides positive electric dipoles and increases the Uvvt, and a second material that provides negative electric dipoles and reduces the initial threshold voltage of the semiconductor device. Based on the introduced high-k layer over the channel layer, the Uvvt of the memory device can be adjusted.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a channel structure that extends from a side of a substrate, the channel structure having sidewalls and a bottom region, the channel structure further including a bottom channel contact that is positioned at the bottom region, a channel dielectric region that includes side portions along the sidewalls of the channel structure and a bottom portion over the bottom channel contact, and a channel layer that is formed along the side portions of the channel dielectric region and further extends through the bottom portion of the channel dielectric region so as to be in contact with the bottom channel contact; and
   a high-k layer that is formed over the channel layer along the sidewalls of the channel structure and over the bottom channel contact.

2. The device of claim 1, wherein the high-k layer comprises a first material that increases an initial threshold voltage (Uvvt) of the semiconductor device, and a second material that reduces the initial threshold voltage of the semiconductor device.

3. The device of claim 2, wherein an increased thickness of the high-k layer results in a larger change of the initial threshold voltage of the semiconductor device.

4. The device of claim 2, wherein the first material comprises $HfO_2$ and $Al_2O_3$, and the second material comprises $La_2O_3$ and $Y_2O_3$.

5. The device of claim 1, wherein the channel dielectric region further comprises:
   a blocking layer including side portions along the sidewalls of the channel structure and a bottom portion covering a first portion of the bottom channel contact;
   a charge trapping layer formed over the blocking layer, the charge trapping layer having side portions positioned along the side portions of the blocking layer and a bottom portion over the bottom portion of the blocking layer; and a tunneling layer formed over the charge trapping layer, the tunneling layer having side portions positioned along the side portions of the charge trapping layer and a bottom portion over the bottom portion of the charge trapping layer, wherein the channel layer is positioned over the tunneling layer and further extends through the bottom portions of the blocking layer, the charge trapping layer, and the tunneling layer so as to contact a second portion of the bottom channel contact.

6. The device of claim 1, wherein the channel dielectric region further comprises:

a blocking layer including side portions along the sidewalls of the channel structure and a bottom portion covering a first top surface of the bottom channel contact;

a charge trapping layer formed over the blocking layer, the charge trapping layer having side portions positioned along the side portions of the blocking layer and a bottom portion over the bottom portion of the blocking layer; and a tunneling layer formed over the charge trapping layer, the tunneling layer having side portions positioned along the side portions of the charge trapping layer and a bottom portion over the bottom portion of the charge trapping layer, wherein the channel layer is positioned over the tunneling layer, extends through the bottom portions of the blocking layer and the charge trapping layer, and further extends into the bottom channel contact so as to contact a second top surface of the bottom channel contact, the second top surface being positioned below the first top surface of the bottom channel contact.

7. The device of claim 1, further comprising:

a plurality of word lines that are positioned over the substrate; and a plurality of insulating layers that are positioned over the substrate, the plurality of word lines and the plurality of insulating layers being alternatingly stacked so that the plurality of word lines are spaced apart from one another by the plurality of the insulating layers, the channel structure extending through the plurality of word lines and the plurality of insulating layers.

8. A method for forming a semiconductor device, comprising:

forming a channel structure that extends from a side of a substrate, the channel structure having sidewalls and a bottom region, the channel structure further including a bottom channel contact that is positioned at the bottom region, a channel dielectric region that includes side portions along the sidewalls of the channel structure and a bottom portion over the bottom channel contact, and a channel layer that is formed along the side portions of the channel dielectric region and further extends through the bottom portion of the channel dielectric region so as to be in contact with the bottom channel contact; and forming a high-k layer over the channel layer along the sidewalls of the channel structure and over the bottom channel contact.

9. The method of claim 8, further comprising:

forming a plurality of word lines that are positioned over the substrate; and forming a plurality of insulating layers that are positioned over the substrate, the plurality of word lines and the plurality of insulating layers being alternatingly stacked so that the plurality of word lines are spaced apart from one another by the plurality of the insulating layers.

10. The method of claim 9, wherein forming the channel structure comprises:

forming a channel opening that extends through the plurality of word lines and the plurality of insulating layers, and further extends into the substrate, the channel opening having sidewalls and a bottom region to expose the substrate;

forming the bottom channel contact at the bottom region of the channel opening, the bottom channel contact being formed along the sidewalls of the channel opening and further extending into the substrate;

forming a blocking layer of the channel dielectric region along the sidewalls of the channel opening and over the bottom channel contact, the blocking layer having side portions along the sidewalls of the channel opening and a bottom portion covering the bottom channel contact;

forming a charge trapping layer of the channel dielectric region over the blocking layer, the charge trapping layer having side portions along the side portions of the blocking layer and a bottom portion over the bottom blocking layer;

forming a tunneling layer of the channel dielectric region over the charge trapping layer, the tunneling layer having side portions along the side portions of the charge trapping layer and a bottom portion over the bottom portion of the charge trapping layer;

forming a bottom opening that extends through the bottom portions of the blocking layer, the charge trapping layer, and the tunneling layer to expose the bottom channel contact; and forming the channel layer over the tunneling layer and through the bottom opening so that the channel layer extends through the bottom portions of the blocking layer, the charge trapping layer, and the tunneling layer and contacts the bottom channel contact.

11. The method of claim 10, further comprising:

forming the bottom opening that extends through the bottom portions of the blocking layer, the charge trapping layer, and the tunneling layer, and further extends into the bottom channel contact so that the blocking layer, the charge trapping layer, and the tunneling layer are arranged over a first top surface of the bottom channel contact; and forming the channel layer over the tunneling layer and through the bottom opening, the channel layer extending through the bottom portion of the blocking layer and the charge trapping layer, and further extending into the bottom channel contact so that the channel layer is positioned over a second top surface of the bottom channel contact, the second top surface being positioned below the first top surface of the bottom channel contact.

12. The method of claim 10, further comparing:

forming a dielectric layer over the channel layer along the sidewalls of the channel opening; and forming the high-k layer over the dielectric layer so that the dielectric layer is positioned between the high-k layer and the channel layer.

13. The method of claim 12, wherein side portions of the high-k layer formed along the sidewalls of the channel opening are spaced apart from the channel layer by the dielectric layer, and a bottom portion of the high-k layer over the bottom channel contact is in contact with the channel layer.

14. The method of claim 8, wherein the high-k layer comprises a first material that increases an initial threshold voltage (Uvvt) of the semiconductor device, and a second material that reduces the initial threshold voltage of the semiconductor device.

15. A 3D NAND memory device, comprising:
   a substrate;
   a plurality of word lines that are positioned over the substrate;
   a plurality of insulating layers that are positioned over the substrate, the plurality of word lines and the plurality of insulating layers being alternatingly stacked so that the plurality of word lines are spaced apart from one another by the plurality of the insulating layers;
   a channel structure that extends through the plurality of word lines and the plurality of insulating layers from the substrate, the channel structure having sidewalls and a bottom region, the channel structure further including a bottom channel contact that is positioned at the bottom region, a channel dielectric region that includes side portions along the sidewalls of the channel structure and a bottom portion over the bottom channel contact, and a channel layer that is formed along the side portions of the channel dielectric region and further extends through the bottom portion of the channel dielectric region so as to be in contact with the bottom channel contact; and
   a high-k layer that is formed over the channel layer along the sidewalls of the channel structure and over the bottom channel contact.

16. The device of claim 15, wherein the channel dielectric region further comprises:
   a blocking layer including side portions along the sidewalls of the channel structure and a bottom portion covering a first portion of the bottom channel contact, a second portion of the bottom channel contact being uncovered by the blocking layer;
   a charge trapping layer formed over the blocking layer, the charge trapping layer having side portions positioned along the side portions of the blocking layer and a bottom portion over the bottom portion of the blocking layer; and
   a tunneling layer formed over the charge trapping layer, the tunneling layer having side portions positioned along the side portions of the charge trapping layer and a bottom portion over the bottom portion of the charge trapping layer,
   wherein the channel layer being positioned over the tunneling layer, and further extending through the bottom portions of the blocking layer, the charge trapping layer, and the tunneling layer so as to contact the second portion of the bottom channel contact.

17. The device of claim 15, wherein the channel dielectric region further comprises:
   a blocking layer including side portions along the sidewalls of the channel structure and a bottom portion covering a first top surface of the bottom channel contact;
   a charge trapping layer formed over the blocking layer, the charge trapping layer having side portions positioned along the side portions of the blocking layer and a bottom portion over the bottom portion of the blocking layer; and
   a tunneling layer formed over the charge trapping layer, the tunneling layer having side portions positioned along the side portions of the charge trapping layer and a bottom portion over the bottom portion of the charge trapping layer,
   wherein the channel layer is positioned over the tunneling layer, extends through the bottom portions of the blocking layer and the charge trapping layer, and further extends into the bottom channel contact so as to contact a second top surface of the bottom channel contact, the second top surface being positioned below the first top surface of the bottom channel contact.

18. The device of claim 15, wherein the channel structure further comprises:
   a dielectric layer formed over the channel layer and along the sidewalls of the channel structure, wherein:
   the high-k layer is positioned over the dielectric layer so that the dielectric layer is positioned between the high-k layer and the channel layer; and
   side portions of the high-k layer formed along the sidewalls of the channel structure are spaced apart from the channel layer by the dielectric layer, and a bottom portion of the high-k layer over the bottom channel contact is in contact with the channel layer.

19. A semiconductor device, comprising:
   a channel structure that extends from a side of a substrate, the channel structure having sidewalls and a bottom region, the channel structure further including a bottom channel contact that is positioned at the bottom region and a channel layer that is formed along the sidewalls and over the bottom channel contact;
   a dielectric layer formed over the channel layer and along the sidewalls of the channel structure; and
   a high-k layer that is formed over the dielectric layer and along the sidewalls of the channel structure, and further positioned over the bottom channel contact.

20. The semiconductor device of claim 19, wherein side portions of the high-k layer formed along the sidewalls of the channel structure are spaced apart from the channel layer by the dielectric layer, and a bottom portion of the high-k layer over the bottom channel contact is in contact with the channel layer.

21. The semiconductor device of claim 19, wherein the channel structure further comprises:
   a channel dielectric region that includes side portions along the sidewalls of the channel structure and a bottom portion over the bottom channel contact, wherein:
   the channel layer has side portions formed along the side portions of the channel dielectric region and a bottom portion further extending through the bottom portion of the channel dielectric region so as to be in contact with the bottom channel contact.

22. The semiconductor device of claim 21, wherein the dielectric layer is formed along the side portions of the channel layer and disposed over on the bottom portion of the channel layer.

23. The semiconductor device of claim 21, wherien the channel dielectric region further comprises:
   a blocking layer including side portions along the sidewalls of the channel structure and a bottom portion covering a first portion of the bottom channel contact;
   a charge trapping layer formed over the blocking layer, the charge trapping layer having side portions positioned along the side portions of the blocking layer and a bottom portion over the bottom portion of the blocking layer; and a tunneling layer formed over the charge trapping layer, the tunneling layer having side portions positioned along the side portions of the charge trapping layer and a bottom portion over the bottom portion of the charge trapping layer.

24. The semiconductor device of claim 23, wherein:

the side portions of the channel layer are positioned over the side portions of the tunneling layer, and the bottom portion of the channel layer extends through the bottom portions of the blocking layer, the charge trapping layer, and the tunneling layer so as to be in contact with a second portion of the bottom channel contact.

\* \* \* \* \*